United States Patent
Morgan et al.

(10) Patent No.: US 9,912,030 B2
(45) Date of Patent: Mar. 6, 2018

(54) DIELECTRIC WAVEGUIDE HAVING A CORE AND A CLADDING BODY, WHERE RIBS EXTEND FROM THE CLADDING BODY

(71) Applicants: TYCO ELECTRONICS CORPORATION, Berwyn, PA (US); Tyco Electronics (Shanghai) Co., Ltd., Shanghai (CN)

(72) Inventors: Chad William Morgan, Carneys Point, NJ (US); Liang Huang, Chengdu (CN)

(73) Assignees: TE CONNECTIVITY CORPORATION, Berwyn, PA (US); TYCO ELECTRONICS (SHANGHAI) CO., LTD., Shanghai (CN)

( * ) Notice: Subject to any disclaimer, the term of this patent is extended or adjusted under 35 U.S.C. 154(b) by 100 days.

(21) Appl. No.: 15/002,565

(22) Filed: Jan. 21, 2016

(65) Prior Publication Data

US 2017/0170539 A1 Jun. 15, 2017

(30) Foreign Application Priority Data

Dec. 14, 2015 (CN) .......................... 2015 1 0922442

(51) Int. Cl.
 *H01P 3/16* (2006.01)
 *H05K 9/00* (2006.01)
 *H01P 3/12* (2006.01)

(52) U.S. Cl.
 CPC ............... *H01P 3/16* (2013.01); *H01P 3/122* (2013.01); *H05K 9/0049* (2013.01)

(58) Field of Classification Search
 CPC .... H01P 3/16; H01P 3/20; H01P 3/121; H01P 3/122
 USPC ......................................... 333/239, 241, 242
 See application file for complete search history.

(56) References Cited

U.S. PATENT DOCUMENTS

| | | | |
|---|---|---|---|
| 2,829,351 A | 4/1958 | Fox | |
| 4,216,449 A * | 8/1980 | Kach | H01P 3/16 333/236 |
| 4,525,693 A | 6/1985 | Suzuki et al. | |
| 4,875,026 A | 10/1989 | Walter et al. | |
| 2012/0306587 A1 | 12/2012 | Strid et al. | |
| 2014/0240187 A1 | 8/2014 | Herbsommer et al. | |
| 2014/0285291 A1 | 9/2014 | Payne et al. | |
| 2014/0368301 A1 | 12/2014 | Herbsommer et al. | |
| 2015/0327357 A1* | 11/2015 | Khan et al. | H01P 3/084 333/1 |
| 2017/0170538 A1 | 6/2017 | Morgan et al. | |
| 2017/0170540 A1 | 6/2017 | Morgan et al. | |

\* cited by examiner

*Primary Examiner* — Benny Lee (57) ABSTRACT

A dielectric waveguide for propagating electromagnetic signals includes a cladding and an electrically conductive shield. The cladding has a body composed of a first dielectric material. The body defines a core region therethrough that is filled with a second dielectric material different than the first dielectric material. The cladding further includes at least two ribs extending from an outer surface of the body to distal ends. The shield engages the distal ends of the ribs and peripherally surrounds the cladding such that air gaps are defined radially between the outer surface of the body and an interior surface of the shield.

20 Claims, 4 Drawing Sheets

DIELECTRIC WAVEGUIDE HAVING A CORE AND A CLADDING BODY, WHERE RIBS EXTEND FROM THE CLADDING BODY

CROSS-REFERENCE TO RELATED APPLICATIONS

This application claims priority to Chinese Patent Application No. 201510922442.6, filed on 14 Dec. 2015, which is incorporated by reference herein in its entirety.

BACKGROUND OF THE INVENTION

The subject matter herein relates generally dielectric waveguides.

Dielectric waveguides are used in communications applications to convey signals in the form of electromagnetic waves along a path. Dielectric waveguides provide communication transmission lines for connecting communication devices, such as connecting an antenna to a radio frequency transmitter and/or receiver. Although waves in open space propagate in all directions, dielectric waveguides generally confine the waves and direct the waves along a defined path, which allows the waveguides to transmit high frequency signals over relatively long distances.

Dielectric waveguides include at least one dielectric material, and typically have two or more dielectric materials. A dielectric is an electrical insulating material that can be polarized by an applied electrical field. The polarizability of a dielectric material is expressed by a value called the "dielectric constant" or "relative permittivity." The dielectric constant of a given material is its dielectric permittivity expressed as a ratio relative to the permittivity of a vacuum, which is 1 by definition. A first dielectric material with a greater dielectric constant than a second dielectric material is able to store more electrical charge by means of polarization than the second dielectric material.

Some known dielectric waveguides include a core dielectric material and a cladding dielectric material that surrounds the core dielectric material. The dielectric constants, in addition to the dimensions and other parameters, of each of the core dielectric material and the cladding dielectric material affect how an electromagnetic field through the waveguide is distributed within the waveguide. In known dielectric waveguides, the electromagnetic field typically has a distribution that extends radially through the core dielectric material, the cladding dielectric material, and even partially outside of the cladding dielectric material (for example, within the air outside of the waveguide).

There are several issues associated with portions of the electromagnetic field extending outside of the cladding of the dielectric waveguide into the surrounding environment. First, the portions of the electromagnetic field outside of the waveguide may produce high crosstalk levels when multiple dielectric waveguides are bundled together in a cable, and the level of crosstalk increases with higher modulated frequencies propagating through the waveguides. Second, some electromagnetic fields in air may travel faster than fields that propagate within the waveguide, which leads to the undesired electrical effect called "dispersion." Dispersion occurs when some frequency components of a signal travel at a different speed than other frequency components of the signal, resulting in inter-signal interference. Third, the dielectric waveguide may experience interference and signal degradation due to external physical influences that interact with the electromagnetic field, such as a human hand touching the dielectric waveguide. Finally, portions of the electromagnetic field outside of the waveguide may be lost along bends in the waveguide, as uncontained fields tend to radiate away in a straight line instead of following the contours of the waveguide.

One potential solution for at least some of these issues is to increase the overall diameter of the dielectric waveguides, such as by increasing the diameter of the cladding layer or the diameter of a dielectric outer jacket layer that surrounds the cladding layer. Increasing the amount of dielectric material provides better field containment and reduces the amount or extent of the electromagnetic field propagating outside of the waveguide. But, increasing the size of the dielectric waveguide introduces other drawbacks, including reduced flexibility of the waveguides, increased material costs, and a reduced number of waveguides that can fit within a given area or space (for example, reducing the density of waveguides).

Another potential solution is to provide an electrically conductive shielding layer that engages the outer dielectric layers of the waveguide and surrounds the full perimeter of the waveguide. But, completely encasing the dielectric waveguide with a conductive material can cause undesirably high energy loss levels (for example, insertion loss and/or return loss) in the waveguides as portions of the electromagnetic fields induce surface currents in the conductive material. High loss levels shorten the effective length that an electromagnetic wave will propagate through the waveguide. Furthermore, outer metal shielding layers interacting with the propagating electromagnetic waves can allow undesirable modes of propagation that have hard cutoff frequencies. For example, at some specific frequencies, the shielding layers can completely halt or "cutoff" the desired field propagation.

A need remains for a dielectric waveguide for propagating high frequency electromagnetic signals that has a relatively compact size and a reduced sensitivity to external influences (for example, crosstalk and other interference), while providing acceptably low levels of loss and avoiding unwanted mode propagation.

SUMMARY OF THE INVENTION

In an embodiment, a dielectric waveguide for propagating electromagnetic signals is provided. The dielectric waveguide includes a cladding and an electrically conductive shield. The cladding has a body composed of a first dielectric material. The body defines a core region therethrough that is filled with a second dielectric material different than the first dielectric material. The cladding further includes at least two ribs extending from an outer surface of the body toward distal ends. The shield engages the distal ends of the ribs and peripherally surrounds the cladding such that air gaps are defined radially between the outer surface of the body and an interior surface of the shield.

In another embodiment, a dielectric waveguide for propagating electromagnetic signals is provided. The dielectric waveguide includes a cladding and an electrically conductive shield. The cladding has a body composed of a first dielectric material. The body defines a core region therethrough that is filled with a second dielectric material different than the first dielectric material. The cladding further includes at least three ribs extending from an outer surface of the body towards distal ends. The shield engages the distal ends of the ribs and peripherally surrounds the cladding such that multiple air gaps are defined radially between the outer surface of the body of the cladding and an interior surface of the shield. The shield has a polygonal cross-sectional shape with multiple linear walls and corners at intersections between adjacent linear walls. The distal ends of the ribs engage the corners of the shield.

DETAILED DESCRIPTION OF THE INVENTION

One or more embodiments described herein are directed to a dielectric waveguide for propagating electromagnetic signals. The embodiments of the dielectric waveguide have a conductive shield placed on the outside of the waveguide in a way to reduce crosstalk and other external interference while at the same time not introducing unwanted mode propagation or undesirably high levels of loss in the waveguide. Lower loss levels allow the waveguides to convey signals farther along a defined path. In one or more embodiments, dielectric extension structures extend beyond a cladding layer and support an electrically conductive shield, such as a metal foil. The extension structures optionally may be extrusion molded as part of the cladding layer of the dielectric waveguide. The extension structures engage and support the shield at locations spaced apart or away from an outer surface or boundary of the cladding such that air-filled gaps or pockets are defined between the cladding and the shield. The extension structures may be configured to keep the space between the cladding and the shield filled with as much air, or another dielectric material having a low dielectric constant, as possible. For example, a majority of the volume or space between the cladding and the shield along the length of the dielectric waveguide may be occupied by air. This strategy keeps the insertion loss of a dielectric waveguide at acceptably low levels, avoids or at least reduces the occurrence of undesirable propagation modes that can cause frequency cutoffs, maintains a reasonable outer diameter of the dielectric waveguide, and provides shielding against crosstalk and other external interference.

Figure 1:
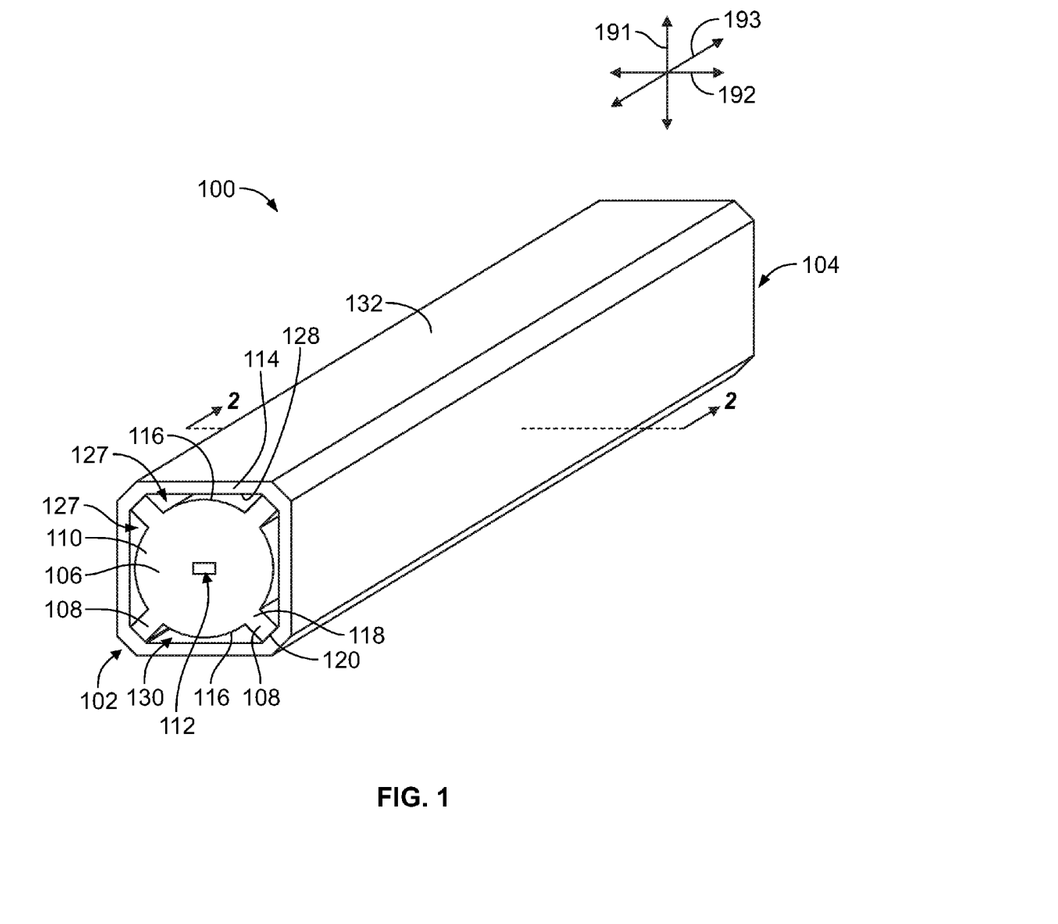
FIG. 1 is a top perspective view of a dielectric waveguide formed in accordance with an embodiment.

FIG. 1 is a top perspective view of a dielectric waveguide 100 formed in accordance with an embodiment. The dielectric waveguide 100 is configured to convey signals in the form of electromagnetic waves or fields along a length of the dielectric waveguide 100 for transmission of the signals between two communication devices (not shown). The communication devices may include antennas, radio frequency transmitters and/or receivers, computing devices (for example, desktop or laptop computers, tablets, smart phones, etc.), media storage devices (for example, hard drives, servers, etc.), network interface devices (for example, modems, routers, etc.), and the like. The dielectric waveguide 100 may be used to transmit high speed signals in the sub-terahertz radio frequency range, such as 120-160 gigahertz (GHz). The high speed signals in this frequency range have wavelengths less than five millimeters. The dielectric waveguide 100 may be used to transmit modulated radio frequency (RF) signals. The dielectric waveguide 100 may also be referred to herein as "waveguide" 100.

The waveguide 100 is oriented with respect to a vertical or elevation axis 191, a lateral axis 192, and a longitudinal axis 193. The axes 191-193 are mutually perpendicular. Although the elevation axis 191 appears to extend in a vertical direction generally parallel to gravity, it is understood that the axes 191-193 are not required to have any particular orientation with respect to gravity. The waveguide 100 is elongated to extend a length between a first end 102 and a second end 104. In the illustrated embodiment, the waveguide extends parallel to the longitudinal axis 193 along the length, but the waveguide 100 may be configured to bend out of the linear orientation shown. The length of the dielectric waveguide 100 may be in the range of one meter to 50 meters, depending on various factors including the distance between two communication devices to be connected, the physical size, structure, and materials of the waveguide 100, the frequency of the signals propagating through the waveguide 100, the signal quality or integrity requirements, and the presence of external influences that may cause interference. One or more embodiments of the waveguide 100 disclosed herein have lengths in the range of 10-25 meters and can convey high speed electromagnetic signals having frequencies between 120 and 160 GHz with acceptable signal quality according to defined standards. In order to connect communication devices that are spaced apart by a distance that is longer than the length of a single waveguide 100, the waveguide 100 may be joined with one or more other waveguides 100 (for example, end-to-end or side-to-side).

The waveguide 100 includes a cladding 110 that has a body 106 formed of a first dielectric material. In an embodiment, the body 106 of the cladding 110 extends the entire length of the waveguide 100 between the first and second ends 102, 104. Alternatively, one or both ends of the body 106 may be recessed, or may protrude from, the corresponding ends 102, 104 of the waveguide 100. The body 106 of the cladding 110 defines a core region 112 therethrough along the length of the body 106. The core region 112 is filled with a second dielectric material that is different than the first dielectric material. As used herein, dielectric materials are electrical insulators that may be polarized by an applied electromagnetic field. The first dielectric material of the body 106 surrounds the second dielectric material of the core region 112. The first dielectric material of the body 106 of the cladding 110 is referred to herein as a "cladding material," and the second dielectric material in the core region 112 is referred to herein as a "core material." The core material has a dielectric constant value that is different than the dielectric constant value of the cladding material. The core material in the core region 112 may be in the solid phase or the gas phase. For example, the core material may be a solid polymer such as polyethylene, polypropylene, polytetrafluoroethylene (PTFE), or the like. Alternatively, the core material may be one or more gases, such as air. Air has a low dielectric constant of approximately 1.0.

The respective dielectric constants of the core material and the cladding material affect the distribution of an electromagnetic field (or wave) propagating within the dielectric waveguide 100. Generally, an electromagnetic field through a dielectric waveguide concentrates within the material that has the greater dielectric constant, at least for materials with dielectric constants in the range of 1-15. In an embodiment, the dielectric constant of the core material in the core region 112 is greater than the dielectric constant of the cladding material, such that electromagnetic fields generally concentrate within the core region 112, although minor portions of the electromagnetic fields may be distributed within the body 106 of the cladding 110 and/or outside of the body 106. In another embodiment, the dielectric constant of the core material is less than the dielectric constant of the cladding material, so the electromagnetic fields concentrate generally within the body 106 of the cladding 110, and may have minor portions within the core region 112 radially interior of the body 106 and/or outside of the body 106.

In an embodiment, the cladding 110 further includes at least two ribs 108 that extend outward from an outer surface 116 of the body 106. The ribs 108 each have a height that extends from a proximal end 118 secured to the outer surface 116 to a distal end 120 away from the outer surface 116. The ribs 108 extend longitudinally for substantially the entire length of the body 106 of the cladding 110 between the first and second ends 102, 104. In an embodiment, the ribs 108 are formed integral to the body 106 such that the cladding 110 is a unitary, one-piece structure including both the body 106 and the ribs 108 that extend therefrom. Alternatively, the ribs 108 may be separate and discrete components that are mounted to the body 106, such as through an adhesive or another bonding agent, a mechanical fastener, or the like.

The dielectric waveguide 100 further includes an electrically conductive shield 114 that peripherally surrounds the cladding 110. The shield 114 is composed of one or more metals that provide the shield 114 with electrically conductive properties. The shield 114 provides electromagnetic shielding for the waveguide 100 against crosstalk and other forms of interference that degrade signal transmission. In an exemplary embodiment, the shield 114 does not directly engage the entire outer surface 116 of the body 106 of the cladding 110, such that at least some air gaps 127 are defined radially between the outer surface 116 of the body 106 and an interior surface 128 of the shield 114. For example, the shield 114 engages the distal ends 120 of the ribs 108 around the perimeter of the cladding 110. Since the distal ends 120 are spaced apart from the outer surface 116 of the body 106, the ribs 108 hold at least portions of the shield 114 at spaced apart distances from the outer surface 116, defining air gaps 127 therebetween. In one or more embodiments, the interior surface 128 of the shield 114 engages the distal ends 120 of the ribs 108 and does not engage the outer surface 116 of the body 106. Thus, individual air gaps 127 are formed circumferentially between adjacent ribs 108, and the air gaps 127 extend radially between the outer surface 116 of the body 106 and the interior surface 128 of the shield 114. In an alternative embodiment, the interior surface 128 of the shield 114 engages some, but not all, portions of the outer surface 116 of the body 106. Although described as "air gaps," the gaps 127 may be occupied by one or more gases other than air instead of air or in addition to air.

The shield 114 fully surrounds the cladding 110. For example, the shield 114 is a hollow cylinder or prism that extends substantially the entire length of the cladding 110 and/or the waveguide 100. The shield 114 defines a cavity 130 through the shield 114 along the length thereof. The cavity 130 is open at the first end 102 and at the second end 104 of the waveguide 100. The cladding 110 is disposed within the cavity 130. In an embodiment, an exterior surface 132 of the shield 114 defines an outer boundary of the waveguide 100. As described in more detail below, the shield 114 may conform to the shape of the cladding 110. For example, the shield 114 may be wrapped around the cladding 110 or the shield 114 may be a heat-shrink tubing that constricts or narrows responsive to an application of heat and/or high pressure. Alternatively, the shield 114 may be a pre-formed container that does not conform to the cladding 110, such as a metal prism with rigid or semi-rigid walls.

In an alternative embodiment, the waveguide 100 may further include an outer jacket (not shown) that at least partially surrounds the cladding 110 radially interior of the shield 114. The ribs 108 may extend from the cladding 110 through the outer jacket or may extend from an outer surface of the outer jacket. The outer jacket is composed of a dielectric material. Air gaps are defined between an outer surface of the jacket and the interior surface 128 of the shield 114.

Figure 2:
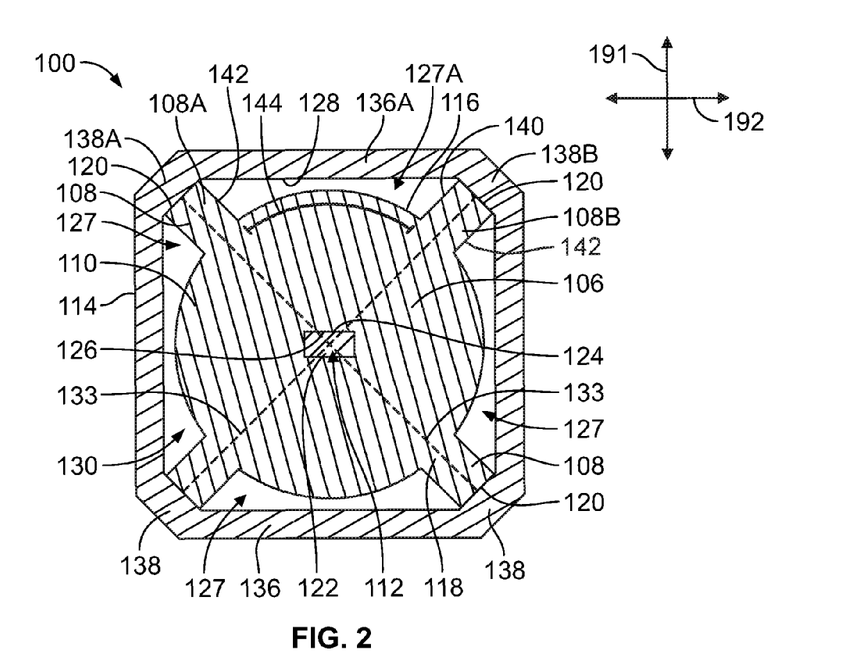
FIG. 2 is a cross-sectional view of the embodiment of the dielectric waveguide shown in FIG. 1 taken along line 2-2 shown in FIG. 1.

FIG. 2 is a cross-sectional view of the embodiment of the waveguide 100 shown in FIG. 1 taken along line 2-2 shown in FIG. 1. In the illustrated embodiment, the body 106 of the cladding 110 has a circular cross-sectional shape. The diameter of the body 106 may be between 1 and 10 mm, or more specifically between 2 and 4 mm. The core region 112 has a rectangular cross-sectional shape. The rectangular shape of the core region 112 may support field polarization of the electromagnetic waves propagating therethrough in an approximately horizontal or vertical direction. The cross-sectional area of the core region 112 may be between 0.08 and 3 $mm^2$, or more specifically between 0.1 and 1 $mm^2$. In the illustrated embodiment, the core region 112 is filled with solid core member 122. The core member 122 is composed of at least one dielectric polymer material (defining the core material), such as polypropylene, polyethylene, PTFE, polystyrene, a polyimide, a polyamide, or the like, including combinations thereof. The core member 122 fills the core region 112 such that no clearances or gaps exist between an outer surface 124 of the core member 122 and an inner surface 126 of the body 106 defining the core region 112. The cladding 110 engages and surrounds the core member 122 along the length of the core member 122. In an alternative embodiment, the core material may be air or another gas-phase dielectric material instead of the solid core member 122.

The body 106 of the cladding 110 is composed of a dielectric polymer material, such as polypropylene, polyethylene, PTFE, polystyrene, a polyimide, a polyamide, or the like, including combinations thereof. These materials generally have low loss characteristics which allow the waveguide 100 to transmit the signals for longer distances. The cladding material is different than the core material, such that the dielectric constant of the waveguide 100 changes upon crossing an interface between the core member 122 and the body 106 of the cladding 110. In an embodiment, the ribs 108 are composed of the same dielectric polymer material as the body 106 of the cladding 110. For example, the ribs 108 may be integral extensions that protrude from the outer surface 116 of the body 106. The ribs 108 therefore may be formed integral to the body 106 such that the cladding 110 is a unitary, one-piece structure. The cladding 110 may be fabricated by extrusion, molding, drawing, fusing, or the like. In an alternative embodiment, the ribs 108 may be formed separately from the body 106 and secured to the body 106 after formation by an adhesive, a mechanical fastener, or the like.

In the illustrated embodiment, the cladding 110 includes four ribs 108. The ribs 108 each extend radially from the body 106. For example, the heights of the ribs 108 from the proximal ends 118 to the distal ends 120 are oriented along axes or rays 133 that intersect one another at the center of the circular cross-section of the body 106. Furthermore, the ribs 108 in the illustrated embodiment are equally spaced apart from one another around the circumference of the body 106. More specifically, the ribs 108 are angularly spaced approximately 90 degrees apart from one another around the circumference of the body 106. At least some of the ribs 108 extend the same radial height from the outer surface 116 of the body 106. For example, all of the four ribs 108 in the illustrated embodiment have generally the same height as well as generally the same width as one another. Ignoring the oblong shape of the core region 112, the cross-sectional shape of the cladding 110, including the ribs 108 and the body 106, is symmetric along at least four lines of symmetry that extend through the center of the body 106 (for example, two lines of symmetry along the rays 133, one line along the elevation axis 191, and one line along the lateral axis 192). The cladding 110 shown in FIG. 2 is centrally located in the cavity 130 of the shield 114.

The shield 114 may be formed of one or more metals or metal alloys, including copper, aluminum, silver, or the like. Alternatively, the shield 114 may be a conductive polymer formed by dispersing metal particles within a dielectric polymer. The shield 114 may be in the form of a metal foil, a conductive tape, a thin panel of sheet metal, a conductive heat shrink tubing, or the like. The shield 114 may be applied to the cladding 110 by relatively tightly wrapping or winding the foil or tape around the cladding 110. In the case of a heat shrink tubing, the cladding 110 may be inserted into the cavity 130, and then heat and/or high pressure is applied to shrink and conform the shield 114 to the contours of the cladding 110. In the case of a pre-formed shield 114 having rigid or semi-rigid walls, the cladding 110 may be loaded into the cavity 130 and held in place via an interference fit, an adhesive, or a mechanical fastener.

The shield 114 has a polygonal cross-sectional shape. In the illustrated embodiment, the shield 114 is rectangular (for example, oblong or square) with four linear walls 136 and corners 138 at intersections between adjacent walls 136. The corners 138 shown in FIG. 2 are beveled or chamfered in shape and do not form 90 degree angles between the corresponding adjacent walls 136. The corners 138 engage and are supported by the distal ends 120 of the ribs 108. The distal ends 120 of the ribs 108 in FIG. 2 are flat, and the corners 138 of the shield 114 may conform to the flat ends 120, resulting in the beveled or chamfered shapes that are shown. Each of the walls 136 of the shield 114 extends linearly between the distal ends 120 of two adjacent ribs 108. In an embodiment, at least some of the walls 136 do not directly engage the outer surface 116 of the body 106. Thus, air gaps 127 are defined radially between the outer surface 116 and the interior surface 128 of the shield 114 along the walls 136 that are spaced apart from the body 106.

In the illustrated embodiment, four individual air gaps 127 are defined between the shield 114 and the cladding 110. Each rib 108 includes a first side 140 and an opposite second side 142. The air gaps 127 are defined along both the first and second sides 140, 142 of the ribs 108. For example, a first air gap 127A is an enclosed area or space that is defined in part by a segment 144 of the outer surface 116 of the body 106 between a first rib 108A and a second rib 108B that is adjacent to the first rib 108A. The enclosed area is also defined by the second side 142 of the first rib 108A and the first side 140 of the second rib 108B. The enclosed area is further defined by the interior surface 128 of the shield 114 along a first wall 136A that is opposite the segment 144 of the body 106. The first wall 136A extends between two adjacent corners 138A, 138B. The adjacent corners 138A, 138B engage the distal ends 120 of the first and second ribs 108A, 108B, respectively. In the illustrated embodiment, the other air gaps 127 may have an identical or at least similar size and shape as the air gap 127A.

Although the ribs 108 are solid dielectric materials that extend from the body 106 of the cladding 110 to the shield 114, in an embodiment a majority of the cross-sectional area between the body 106 and the shield 114 is occupied by air. The ribs 108 therefore may have relatively thin widths to provide relatively large air gaps 127 between the ribs 108. The ribs 108 are designed to be sufficiently wide, however, to provide a structurally sound base for supporting the shield 114 without bending or deforming from tension and other forces applied on the ribs 108. At least a majority of each segment 144 along the outer surface 116 between adjacent ribs 108 is exposed to air instead of being engaged by the shield 114. In the illustrated embodiment, an entirety of each of the segments 144 between the ribs 108 is exposed to air because the walls 136 of the shield 114 do not engage any of the segments 144. For example, the ribs 108 extend radially from the body 106 such that the distal ends 120 of the ribs 108 protrude beyond a perimeter of an imaginary square in which the circular body 106 is inscribed. If at least one of the distal ends 120 did not protrude beyond the perimeter of the imaginary square, one or more of the linear walls 136 would engage one or more of the segments 144 of the outer surface 116 of the body 106.

Air has a low dielectric constant of approximately 1.0, which is lower than the dielectric constants of the solid polymers (for example, polyethylene, polypropylene, and PTFE) used for the core member 122 and/or the cladding 110. Due to the lower dielectric constant, providing air around the cladding 110 results in improved electromagnetic field containment within the core region 112 and the cladding 110 of the waveguide 100 as compared to providing a solid polymer jacket around the cladding 110. Better containment of the electromagnetic fields within the core region 112 and the cladding 110 improves signal transmission by reducing loss and undesirable propagating modes that may occur when portions of the electromagnetic fields interact with the conductive shield 114.

The improved containment provided by air also allows the overall diameter of the waveguide 100 to be smaller than a reference waveguide having a solid polymer jacket layer. For example, the shield 114 shown in FIG. 2 may have a height along the elevation axis 191 of 4 mm and a width along the lateral axis 192 of 4 mm for a total cross-sectional area of 16 mm$^2$. Due to the lower dielectric constant and field containment properties of air, a reference dielectric waveguide that has a solid dielectric polymer outer jacket between a cladding similar to the body 106 and a shield similar to the shield 114 would need to have an overall cross-sectional area greater than 16 mm$^2$ to achieve the same field containment as the illustrated embodiment having the air gaps 127. For example, depending on the solid dielectric material of the jacket that is used, the overall area cross-sectional area of the reference waveguide may be 20 mm$^2$ or more. The increased size of the reference waveguide is undesirable due to reduced flexibility, increased material costs, lower waveguide density in a bundle of waveguides of a given size, and the like.

Figure 3:
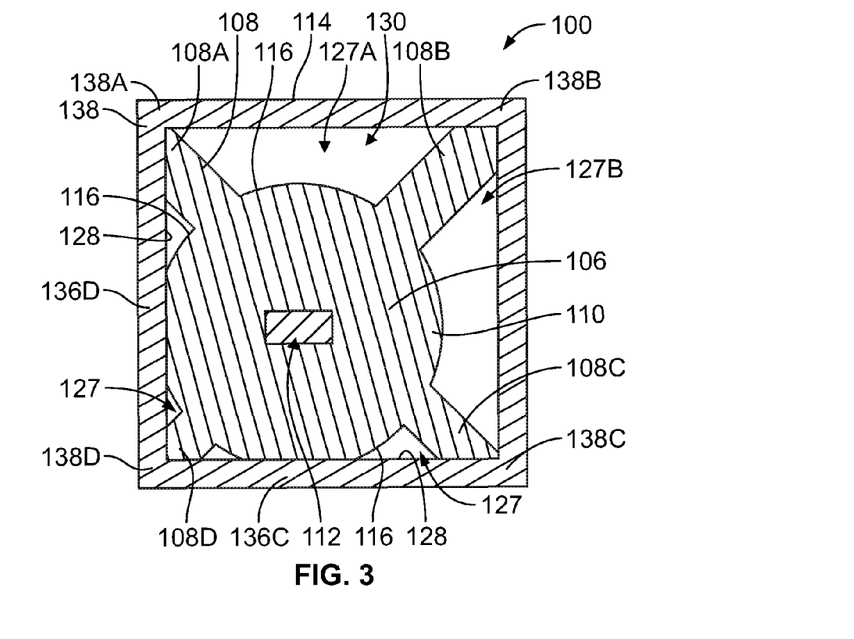
FIG. 3 is a cross-sectional view of another embodiment of the dielectric waveguide.

FIG. 3 is a cross-sectional view of another embodiment of the dielectric waveguide 100. Components of the embodiment shown in FIG. 3 that are similar to components of the embodiment shown in FIGS. 1 and 2 are identified with the same reference numerals. Like the embodiment of the waveguide 100 shown in FIGS. 1 and 2, the waveguide 100 in the illustrated embodiment has a generally circular body 106 of the cladding 110 with four ribs 108 extending radially from the outer surface 116 of the body 106 to corners 138 of the rectangular shield 114. However, the body 106 of the cladding 110 is not centered within the cavity 130 of the shield 114. For example, the body 106 is disposed more proximate to one corner 138D than the location of the body 106 relative to the other three corners 138A, 138B, and 138C. Although the core region 112 of the cladding 110 is centered relative to the circular body 106, the core region 112 is offset relative to the shield 114. In another embodiment the core region 112 may be offset relative to the circular body 106, such as in a more central location relative to the shield 114.

The rib 108D that engages the corner 138D has a smaller radial height than the other ribs 108A, 108B, 108C. Furthermore, the outer surface 116 of the body 106 engages the interior surface 128 of the shield 114 along two walls 136C, 136D, unlike the embodiment shown in FIGS. 1 and 2. However, the shield 114 does not engage the full perimeter of the body 106. Multiple air gaps 127 are defined between the body 106 and the shield 114, including two large air gaps 127A, 127B disposed proximate to the corner 138B that is opposite the corner 138D and farthest from the body 106.

The embodiment of the dielectric waveguide 100 shown in FIGS. 1 and 2, referred to as a "centered waveguide," was experimentally tested with the embodiment of the waveguide 100 shown in FIG. 3, referred to as a "corner waveguide," and a reference waveguide that lacked an electrically conductive shield. The three waveguides were tested over a range of 120 to 160 GHz. The insertion loss of the reference waveguide at 140 GHz was measured as 0.882 dB/m (decibels per meter), while the insertion losses of the centered waveguide and the corner waveguide were 0.950 dB/m and 1.267 dB/m, respectively. The insertion losses of the centered waveguide and the corner waveguide were only slightly higher than the reference waveguide, which lacked any shielding. Thus, both the centered waveguide and the corner waveguide may have acceptably low loss levels while providing shielding against crosstalk and other interference, which is lacking in the reference waveguide. Between the two, the centered waveguide at 0.950 dB/m tested slightly better than the corner waveguide at 1.267 dB/m with regard to return loss.

Figure 4:
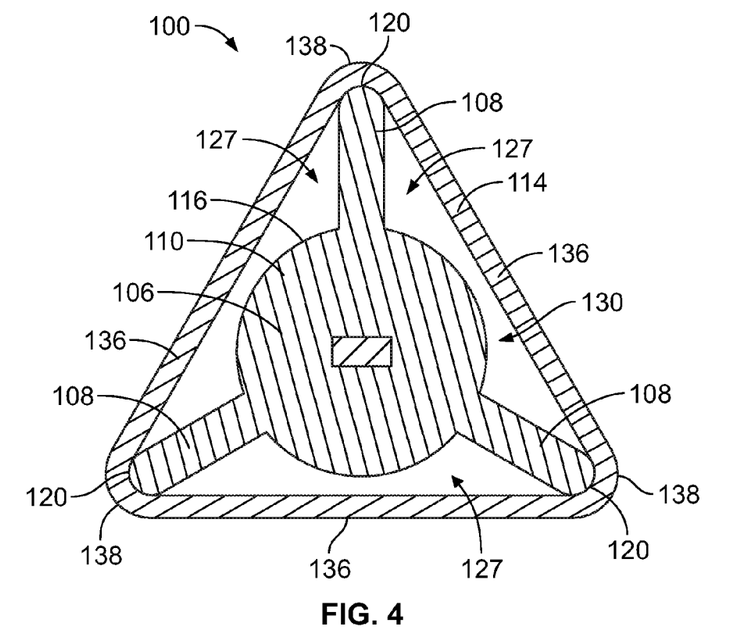
FIG. 4 is a cross-sectional view of the dielectric waveguide according to another embodiment.

FIG. 4 is a cross-sectional view of the dielectric waveguide 100 according to another embodiment. In the illustrated embodiment, the body 106 of the cladding 110 has a circular cross-sectional shape and three ribs 108 extending radially from the body 106. Like the embodiment shown in FIGS. 1 and 2, the ribs 108 are equally spaced apart circumferentially from one another around the body 106. More specifically, the ribs 108 are angularly spaced approximately 120 degrees apart from one another. The radial heights of the ribs 108 from the body 106 to the distal ends 120 may be relatively tall (or long) to support and hold the shield 114 at a sufficient distance from the body 106 such that the walls 136 of the shield 114 do not engage the outer surface 116 of the body 106. The waveguide 100 defines three air gaps 127 in the illustrated embodiment.

The shield 114 may be a metal foil or a conductive tape that is wrapped around the ribs 108, resulting in a triangular cross-sectional shape. The shield 114 alternatively may be a conductive heat shrink tubing that conforms to the ribs 108. As shown in FIG. 4, the distal ends 120 of the ribs 108 may be rounded, such that the shield 114 has curved corners 138 as opposed to the chamfered corners 138 shown in FIGS. 1 and 2. The body 106 of the cladding 110 is generally centered within the cavity 130 of the shield 114.

Figure 5:
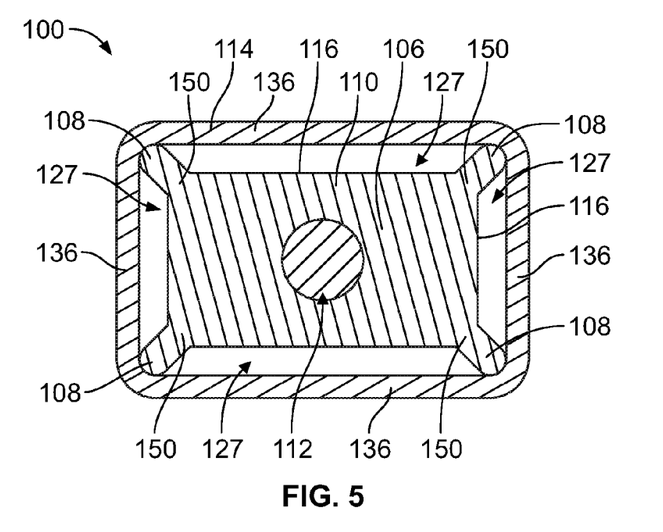
FIG. 5 is a cross-sectional view of the dielectric waveguide according to another embodiment.

FIG. 5 is a cross-sectional view of the dielectric waveguide 100 according to another embodiment. In FIG. 5, the body 106 of the cladding 110 has a rectangular cross-sectional shape with four corners 150. The core region 112 defined in the body 106 has a circular cross-sectional shape. The cladding 110 further includes four ribs 108 that extend generally radially from the corners 150 of the body 106. Each of the four ribs 108 extends from a different one of the corners 150. The ribs 108 support and hold the shield 114 at a spaced apart location from the body 106 such that none of the walls 136 of the shield 114 directly engage the outer surface 116 of the body 106. The waveguide 100 defines four air gaps 127 in FIG. 5.

Figure 6:
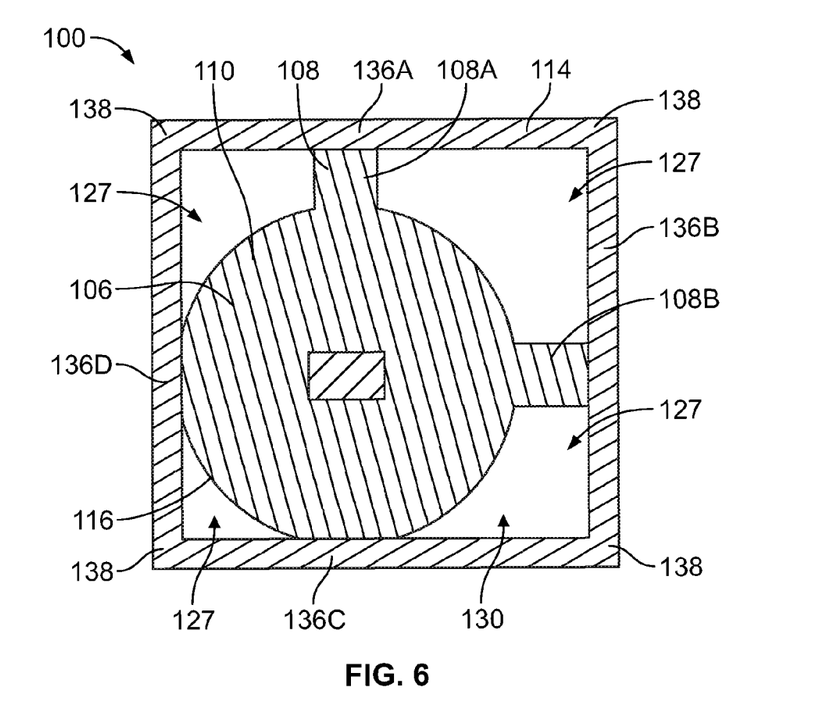
FIG. 6 is a cross-sectional view of the dielectric waveguide according to another embodiment.

Although the embodiments of the dielectric waveguide 100 shown and described above all have either three or four ribs 108, other embodiments may include more than four ribs 108 or less than four ribs 108. For example, FIG. 6 is a cross-sectional view of the dielectric waveguide 100 according to another embodiment that includes two ribs 108 extending outward from the body 106 of the cladding 110. A first rib 108A of the two ribs 108 engages a first wall 136A of the shield 114, and a second rib 108B engages a second wall 136B of the shield 114. The outer surface 116 of the body 106 engages a third wall 136C and a fourth wall 136D of the shield 114. The walls 136A-136D of the shield 114 may be at least semi-rigid to support the rectangular cross-sectional shape of the shield 114. The walls 136A-136D may be formed of thin metal panels or sheets. For example, the shield 114 may be a pre-formed container that is self-supported. As shown, no portions of the cladding 110 engage the corners 138 of the shield 114 to support the shield 114. In the embodiment shown in FIG. 6, instead of supporting the shield 114 to hold the walls 136A-136D away from the body 106, the ribs 108A, 108B are used for positioning and holding the cladding 110 within the cavity 130 of the shield 114. For example, the cladding 110 may be wedged within the cavity 130 such that the cladding 110 engages all four walls 136A-136D and is prohibited from rotating or moving vertically or laterally relative to the shield 114. The waveguide 100 shown in FIG. 6 defines four air gaps 127 between the body 106 and the shield 114.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A dielectric waveguide for propagating electromagnetic signals, the dielectric waveguide comprising:
a cladding having a body composed of a first dielectric material, the body defining a core region therethrough that is filled with a second dielectric material different than the first dielectric material, the cladding further including ribs extending from an outer surface of the body toward respective distal ends, at least one of the body of the cladding or the core region of the cladding having a respective rectangular cross-sectional shape; and
an electrically conductive shield engaging the distal ends of the ribs and peripherally surrounding the cladding such that air gaps are defined radially between the outer surface of the body and an interior surface of the shield.

2. The dielectric waveguide of claim 1, wherein the shield does not directly engage the outer surface of the body.

3. The dielectric waveguide of claim 1, wherein a majority of a cross-sectional area defined between the body and the shield is occupied by air.

4. The dielectric waveguide of claim 1, wherein the second dielectric material that fills the core region is air.

5. The dielectric waveguide of claim 1, wherein the shield is at least one of a tape, a heat shrink tubing, or a foil, the shield conforming around the distal ends of the ribs.

6. The dielectric waveguide of claim 1, wherein the ribs extend radially from the body.

7. The dielectric waveguide of claim 1, wherein the body of the cladding has a circular cross-sectional shape and the ribs are equally spaced apart circumferentially from one another, the core region of the cladding having the rectangular cross-sectional shape.

8. The dielectric waveguide of claim 1, wherein the ribs are integral to the body as a unitary, one-piece cladding such that the ribs are composed of the first dielectric material.

9. The dielectric waveguide of claim 1, wherein the interior surface of the shield defines a cavity, the body of the cladding being centrally located in the cavity.

10. The dielectric waveguide of claim 1, wherein the body of the cladding has the rectangular cross-sectional shape with four corners, the cladding having four of the ribs, each of the four ribs extending from a different corresponding one of the four corners.

11. The dielectric waveguide of claim 1, wherein the cladding includes at least three of the ribs, the shield having walls that extend linearly between the distal ends of adjacent ribs of the at least three ribs.

12. The dielectric waveguide of claim 1, wherein the body of the cladding extends a length between a first end and an opposite second end, each of the ribs extending substantially the entire length of the body between the first and second ends.

13. A dielectric waveguide for propagating electromagnetic signals, the dielectric waveguide comprising:
a cladding having a body composed of a first dielectric material, the body defining a core region therethrough that is filled with air, the cladding further including at least three ribs extending from an outer surface of the body toward respective distal ends; and
an electrically conductive shield engaging the distal ends of the at least three ribs and peripherally surrounding the cladding such that multiple air gaps are defined radially between the outer surface of the body of the cladding and an interior surface of the shield, the shield having a polygonal cross-sectional shape with multiple linear walls and corners at intersections between adjacent linear walls, the distal ends of the at least three ribs engaging the corners of the shield.

14. The dielectric waveguide of claim 13, wherein the shield is at least one of a tape, a heat shrink tubing, or a foil, the shield conforming around the distal ends of the at least three ribs.

15. The dielectric waveguide of claim 13, wherein each of the at least three ribs has a first side and an opposite second side, the air gaps being defined along both the first and second sides of the at least three ribs.

16. The dielectric waveguide of claim 13, wherein the shield does not directly engage the outer surface of the body.

17. The dielectric waveguide of claim 13, wherein at least one of the body of the cladding or the core region of the cladding has a respective rectangular cross-sectional shape.

18. The dielectric waveguide of claim 13, wherein the interior surface of the shield defines a cavity, the body of the cladding being centrally located in the cavity.

19. The dielectric waveguide of claim 13, wherein the body of the cladding has a circular cross-sectional shape and the at least three ribs are equally spaced apart circumferentially from one another.

20. The dielectric waveguide of claim 13, wherein the at least three ribs extend radially from the body, the at least three ribs being integral to the body as a unitary, one-piece cladding such that the at least three ribs are composed of the first dielectric material.

* * * * *